(12) United States Patent
Sato et al.

(10) Patent No.: US 11,430,886 B2
(45) Date of Patent: Aug. 30, 2022

(54) SEMICONDUCTOR DEVICE AND SEMICONDUCTOR MEMORY DEVICE

(71) Applicant: Kioxia Corporation, Tokyo (JP)

(72) Inventors: Yuta Sato, Yokohama Kanagawa (JP); Tomomasa Ueda, Yokohama Kanagawa (JP); Nobuyoshi Saito, Tokyo (JP); Keiji Ikeda, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/198,682

(22) Filed: Mar. 11, 2021

(65) Prior Publication Data
US 2022/0085212 A1   Mar. 17, 2022

(30) Foreign Application Priority Data

Sep. 16, 2020 (JP) .............................. JP2020-155889

(51) Int. Cl.
| | | |
|---|---|---|
| H01L 29/78 | (2006.01) | |
| H01L 27/12 | (2006.01) | |
| H01L 27/13 | (2006.01) | |
| H01L 29/24 | (2006.01) | |
| H01L 29/423 | (2006.01) | |

(52) U.S. Cl.
CPC ...... H01L 29/7827 (2013.01); H01L 27/1203 (2013.01); H01L 27/13 (2013.01); H01L 29/24 (2013.01); *H01L 29/42356* (2013.01)

(58) Field of Classification Search
CPC . H01L 29/7827; H01L 27/13; H01L 27/1203; H01L 29/24; H01L 29/32356; H01L 27/111556

USPC .............................................. 257/43; 438/85
See application file for complete search history.

(56) References Cited

U.S. PATENT DOCUMENTS

| | | |
|---|---|---|
| 9,698,272 B1 | 7/2017 | Ikeda |
| 2014/0183529 A1 | 7/2014 | Yamazaki |
| 2014/0374908 A1 | 12/2014 | Koezuka |
| 2016/0079268 A1* | 3/2016 | Sakuma et al. ... H01L 27/11582 |
| 2019/0058008 A1 | 2/2019 | Yagishita |

(Continued)

FOREIGN PATENT DOCUMENTS

| | | |
|---|---|---|
| JP | 2015-026831 A | 2/2015 |
| JP | 2017-168623 A | 9/2017 |

(Continued)

*Primary Examiner* — Thinh T Nguyen
(74) *Attorney, Agent, or Firm* — Foley & Lardner LLP

(57) ABSTRACT

A semiconductor device of an embodiment includes a substrate, a first electrode, a second electrode, the first electrode provided between the substrate and the second electrode, the oxide semiconductor layer in contact with the first electrode, an oxide semiconductor layer between the first electrode and the second electrode, the oxide semiconductor layer contains Zn and at least one first element selected from In, Ga, Si, Al, and Sn; a conductive layer between the oxide semiconductor layer and the second electrode, the conductive layer in contact with the second electrode, the conductive layer contains O and at least one second element selected from the group consisting of In, Ga, Si, Al, Sn, Zn, and Ti, a gate electrode; and a gate insulating layer between the oxide semiconductor layer and the gate electrode.

18 Claims, 13 Drawing Sheets

(56) References Cited

U.S. PATENT DOCUMENTS

| | | |
|---|---|---|
| 2019/0237581 A1 | 8/2019 | Saito |
| 2019/0296155 A1 | 9/2019 | Sawabe |
| 2020/0111916 A1 | 4/2020 | Karda |

FOREIGN PATENT DOCUMENTS

| | | |
|---|---|---|
| JP | 2019-036664 A | 3/2019 |
| JP | 2019-134077 A | 8/2019 |
| JP | 2020-021949 A | 2/2020 |

* cited by examiner

SEMICONDUCTOR DEVICE AND SEMICONDUCTOR MEMORY DEVICE

CROSS-REFERENCE TO RELATED APPLICATION

This application is based upon and claims the benefit of priority from Japanese Patent Application No. 2020-155889, filed on Sep. 16, 2020, the entire contents of which are incorporated herein by reference.

FIELD

Embodiments described herein relate generally to semiconductor devices and semiconductor memory devices.

BACKGROUND

An oxide semiconductor transistor in which a channel is formed in an oxide semiconductor layer has excellent characteristics that the channel leakage current during an off-operation is extremely small. Therefore, application of an oxide semiconductor transistor to a switching transistor of a memory cell of a dynamic random access memory (DRAM) is being considered, for example.

In a case where an oxide semiconductor transistor is applied to a switching transistor of a memory cell, for example, the oxide semiconductor transistor is subjected to a heat treatment accompanying the formation of wiring lines formed in an upper layer. Therefore, an oxide semiconductor transistor having stable characteristics that hardly fluctuate during the heat treatment is expected to be provided.

DETAILED DESCRIPTION

Figure 1:
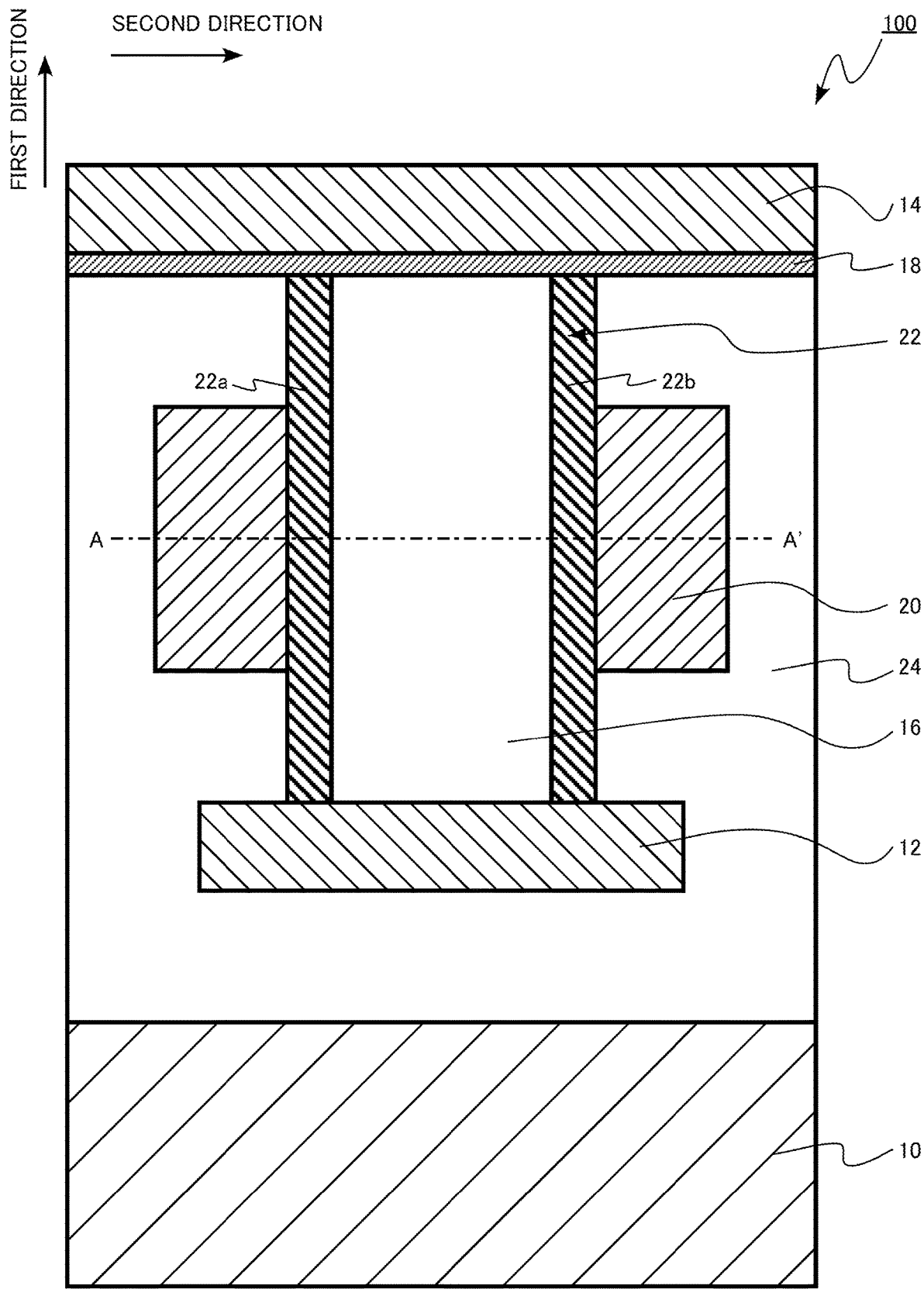
FIG. 1 is a schematic cross-sectional view of a semiconductor device of a first embodiment.

A semiconductor device of an embodiment includes: a substrate; a first electrode; a second electrode, the first electrode provided between the substrate and the second electrode; an oxide semiconductor layer provided between the first electrode and the second electrode, the oxide semiconductor layer being in contact with the first electrode, the oxide semiconductor layer containing zinc (Zn) and at least one first element selected from the group consisting of indium (In), gallium (Ga), silicon (Si), aluminum (Al), and tin (Sn), and a chemical composition of the oxide semiconductor layer being different from a chemical composition of the first electrode and the second electrode; a conductive layer provided between the oxide semiconductor layer and the second electrode, the conductive layer being in contact with the second electrode, the conductive layer containing oxygen (O) and at least one second element selected from the group consisting of indium (In), gallium (Ga), silicon (Si), aluminum (Al), tin (Sn), zinc (Zn), and titanium (Ti), and a chemical composition of the conductive layer being different from a chemical composition of the first electrode, the second electrode, and the oxide semiconductor layer; a gate electrode; and a gate insulating layer provided between the oxide semiconductor layer and the gate electrode.

The following is a description of embodiments, with reference to the accompanying drawings. In the description below, like or similar components are denoted by like reference numerals, and explanation of components described once may not be repeated.

In the present specification, the terms "upper" and "lower" may be used for convenience. The terms "upper" and "lower" are terms that indicate a relative positional relationship in the drawings, and do not define the positional relationship with respect to gravity.

The qualitative analysis and the quantitative analysis of the chemical compositions of the members constituting a semiconductor device and a semiconductor memory device in the present specification can be conducted by secondary ion mass spectroscopy (SIMS), energy dispersive X-ray spectroscopy (EDX), and Rutherford back-scattering spectroscopy (RBS), for example. The thicknesses of the members constituting a semiconductor device and a semiconductor memory device, the distances between the members, the crystal grain size, and the like can be measured with a transmission electron microscope (TEM), for example. Further, the carrier concentration in the members constituting a semiconductor device and a semiconductor memory device can be measured with a scanning spreading resistance microscope (SSRM), for example.

First Embodiment

A semiconductor device of a first embodiment includes: a substrate; a first electrode; a second electrode, the first electrode provided between the substrate and the second electrode; an oxide semiconductor layer provided between the first electrode and the second electrode, the oxide semiconductor layer being in contact with the first electrode, the oxide semiconductor layer containing zinc (Zn) and at least one first element selected from the group consisting of indium (In), gallium (Ga), silicon (Si), aluminum (Al), and tin (Sn), and a chemical composition of the oxide semiconductor layer being different from a chemical composition of the first electrode and the second electrode; a conductive layer provided between the oxide semiconductor layer and the second electrode, the conductive layer being in contact with the second electrode, the conductive layer containing oxygen (O) and at least one second element selected from the group consisting of indium (In), gallium (Ga), silicon (Si), aluminum (Al), tin (Sn), zinc (Zn), and titanium (Ti), and a chemical composition of the conductive layer being different from a chemical composition of the first electrode, the second electrode, and the oxide semiconductor layer; a gate electrode; and a gate insulating layer provided between the oxide semiconductor layer and the gate electrode.

Figure 2:
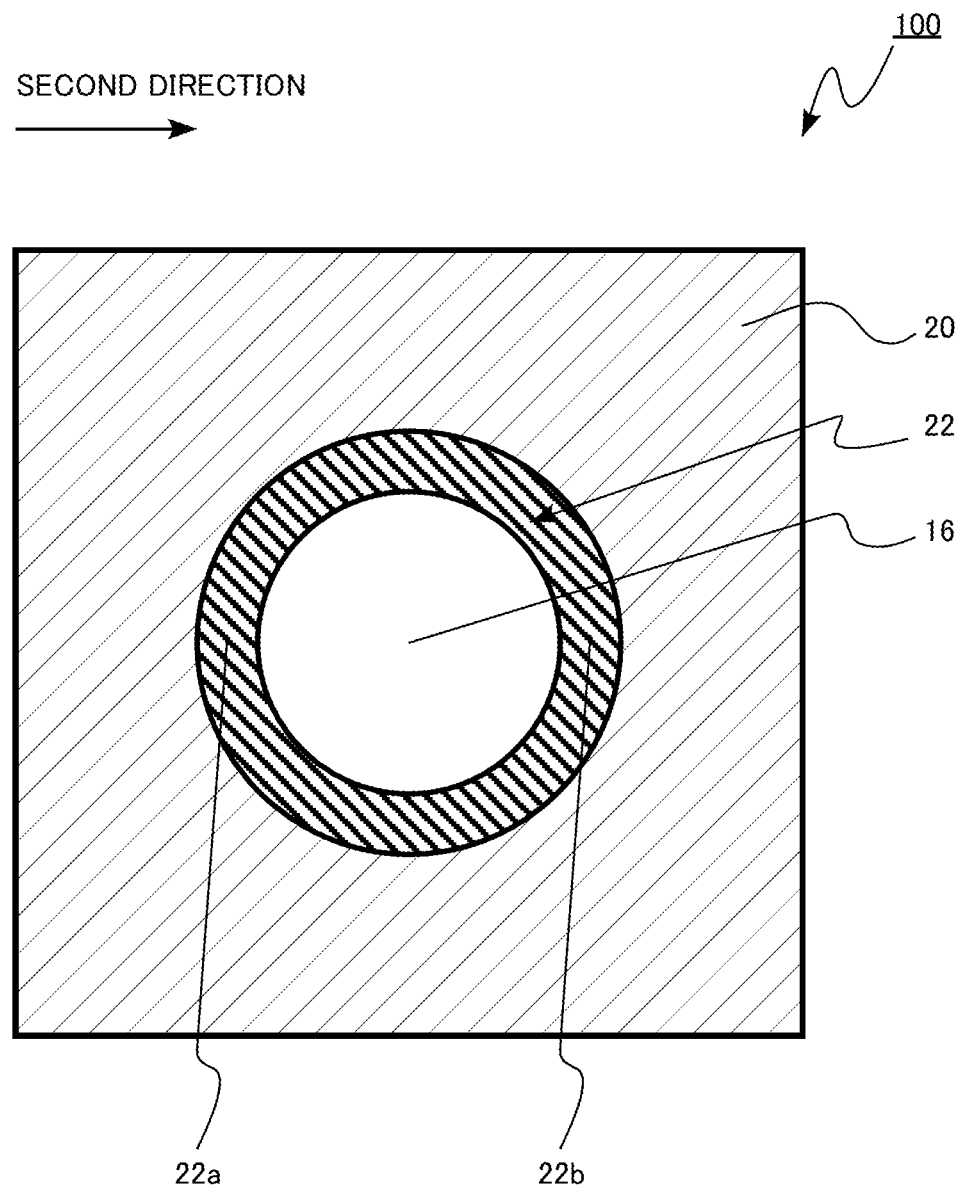
FIG. 2 is a schematic cross-sectional view of the semiconductor device of the first embodiment.

FIGS. 1 and 2 are schematic cross-sectional views of a semiconductor device of a first embodiment. FIG. 2 is a cross-sectional view taken along the A-A' line defined in FIG. 1. In FIG. 1, the vertical direction is referred to as a first direction. In FIG. 1, the horizontal direction is referred to as a second direction. The second direction is perpendicular to the first direction.

The semiconductor device of the first embodiment is a transistor 100. The transistor 100 is an oxide semiconductor transistor in which a channel is formed in an oxide semiconductor. The transistor 100 is a so-called surrounding gate transistor (SGT) in which a gate electrode is provided so as to surround an oxide semiconductor layer in which a channel is formed. The transistor 100 is a so-called vertical transistor.

The transistor 100 includes a silicon substrate 10, a lower electrode 12, an upper electrode 14, a channel layer 16, a contact layer 18, a gate electrode 20, a gate insulating layer 22, and an interlayer insulating layer 24. The gate insulating layer 22 includes a first region 22a and a second region 22b.

The silicon substrate 10 is an example of the substrate. The lower electrode 12 is an example of the first electrode. The upper electrode 14 is an example of the second electrode. The channel layer 16 is an example of the oxide semiconductor layer. The contact layer 18 is an example of the conductive layer.

The silicon substrate 10 is a single-crystal silicon substrate, for example. The silicon substrate 10 is an example of the substrate. The substrate is not necessarily a silicon substrate. The substrate may be a semiconductor substrate other than a silicon substrate, for example. The substrate may be an insulating substrate, for example.

The lower electrode 12 is disposed above the silicon substrate 10. The interlayer insulating layer 24 is disposed between the silicon substrate 10 and the lower electrode 12. The lower electrode 12 is an example of the first electrode.

The lower electrode 12 functions as a source electrode or a drain electrode of the transistor 100.

The lower electrode 12 is a conductor. The lower electrode 12 contains an oxide semiconductor or a metal, for example. The lower electrode 12 is an oxide semiconductor containing indium (In) and tin (Sn), for example. The lower electrode 12 is a metal containing tungsten (W), molybdenum (Mo), copper (Cu), aluminum (Al), titanium (Ti), or tantalum (Ta), for example.

The lower electrode 12 may have a stacked structure formed with a plurality of conductors, for example.

The upper electrode 14 is disposed above the silicon substrate 10. The upper electrode 14 is disposed above the lower electrode 12. The lower electrode 12 is disposed between the silicon substrate 10 and the upper electrode 14. The upper electrode 14 is an example of the second electrode. The direction from the upper electrode 14 toward the lower electrode 12 is the first direction.

The upper electrode 14 functions as a source electrode or a drain electrode of the transistor 100.

The upper electrode 14 is a conductor. The upper electrode 14 contains an oxide semiconductor or a metal, for example. The upper electrode 14 is an oxide semiconductor containing indium (In) and tin (Sn), for example. The upper electrode 14 is a metal containing tungsten (W), molybdenum (Mo), copper (Cu), aluminum (Al), titanium (Ti), or tantalum (Ta), for example.

The upper electrode 14 may have a stacked structure formed with a plurality of conductors, for example.

The channel layer 16 is disposed above the silicon substrate 10. The channel layer 16 is disposed between the lower electrode 12 and the upper electrode 14. The channel layer 16 is in contact with the lower electrode 12. The channel layer 16 is an example of the oxide semiconductor layer.

A channel that serves as a current path during an on-operation of the transistor 100 is formed in the channel layer 16.

The channel layer 16 is an oxide semiconductor. The channel layer 16 is an amorphous layer, for example.

The channel layer 16 contains zinc (Zn). The channel layer 16 contains at least one first element selected from the group consisting of indium (In), gallium (Ga), silicon (Si), aluminum (Al), and tin (Sn).

The channel layer 16 contains indium (In), gallium (Ga), and zinc (Zn), for example. The atomic concentration of the zinc (Zn) in the channel layer 16 is not lower than 5 atomic % and not higher than 20 atomic %, for example.

The channel layer 16 has a different chemical composition from the chemical composition of the lower electrode 12 and the chemical composition of the upper electrode 14.

At least part of the channel layer 16 is an n-type semiconductor. The channel layer 16 contains oxygen deficiency. The oxygen deficiency may be called oxygen vacancy. The oxygen deficiency in the channel layer 16 function as donors.

The length of the channel layer 16 in the first direction is not smaller than 80 nm and not greater than 200 nm, for example. The width of the channel layer 16 in the second direction is not smaller than 20 nm and not greater than 100 nm, for example.

The contact layer 18 is disposed between the channel layer 16 and the upper electrode 14. The contact layer 18 is in contact with the upper electrode 14. The contact layer 18 is in contact with the channel layer 16, for example. The contact layer 18 is an example of the conductive layer.

The contact layer 18 has a function to lower the electrical resistance between the channel layer 16 and the upper electrode 14.

The contact layer 18 is an oxide semiconductor, for example.

The contact layer 18 contains oxygen (O). The contact layer 18 contains at least one second element selected from the group consisting of indium (In), gallium (Ga), silicon (Si), aluminum (Al), tin (Sn), zinc (Zn), and titanium (Ti).

The contact layer 18 contains an oxide. The contact layer 18 is an oxide containing indium (In), tin (Sn), and zinc (Zn), for example.

The contact layer 18 has a different chemical composition from the chemical composition of the lower electrode 12, the chemical composition of the upper electrode 14, and the chemical composition of the channel layer 16.

The contact layer 18 is an n-type semiconductor, for example. The contact layer 18 contains oxygen deficiency. The oxygen deficiency in the contact layer 18 function as donors.

The thickness of the contact layer 18 in the first direction is not smaller than 5 nm and not greater than 20 m, for example.

The density of the oxygen deficiency in the contact layer 18 is higher than the density of the oxygen deficiency in the channel layer 16, for example. The carrier concentration in the contact layer 18 is higher than the carrier concentration in the channel layer 16, for example. The electrical resistivity of the contact layer 18 is lower than the electrical resistivity of the channel layer 16, for example.

The atomic concentration of the tin (Sn) contained in the contact layer 18 is higher than the atomic concentration of the tin (Sn) contained in the channel layer 16, for example. The atomic concentration of the indium (In) contained in the contact layer 18 is higher than the atomic concentration of the indium (In) contained in the channel layer 16, for example.

The gate electrode 20 is disposed so as to surround the channel layer 16. The gate electrode 20 is disposed around the channel layer 16.

The gate electrode 20 is a metal, a metal compound, or a semiconductor, for example. The gate electrode 20 contains tungsten (W), for example.

The gate length of the gate electrode 20 is not smaller than 20 nm and not greater than 100 nm, for example. The gate length of the gate electrode 20 is the length of the gate electrode 20 in the first direction.

The gate insulating layer 22 is disposed between the channel layer 16 and the gate electrode 20. The gate insulating layer 22 is disposed so as to surround the channel layer 16.

The gate insulating layer 22 is in contact with the lower electrode 12, for example. The gate insulating layer 22 is in contact with the contact layer 18, for example.

The gate insulating layer 22 includes a first region 22a and a second region 22b. The channel layer 16 is disposed between the first region 22a and the second region 22b.

The gate insulating layer 22 is an oxide or an oxynitride, for example. The gate insulating layer 22 contains a silicon oxide or an aluminum oxide, for example. The thickness of the gate insulating layer 22 is not smaller than 2 nm and not greater than 10 nm, for example.

Note that an oxide layer (not shown) formed with a different material from the gate insulating layer 22 can be provided between the channel layer 16 and the gate insulating layer 22.

The interlayer insulating layer 24 is disposed between the silicon substrate 10 and the lower electrode 12. The interlayer insulating layer 24 is disposed around the lower electrode 12, the upper electrode 14, and the gate electrode 20.

The interlayer insulating layer 24 is an oxide, a nitride, or an oxynitride, for example. The interlayer insulating layer 24 contains a silicon oxide, a silicon nitride, or a silicon oxynitride, for example.

When the transistor 100 is manufactured, the channel layer 16, the contact layer 18, and the upper electrode 14 are formed in this order, after the lower electrode 12 is formed above the silicon substrate 10.

In the description below, the functions and the effects of the semiconductor device of the first embodiment are explained.

An oxide semiconductor transistor in which a channel is formed in an oxide semiconductor layer has excellent characteristics that the channel leakage current during an off-operation is extremely small. Because of the characteristics, application of an oxide semiconductor transistor to a switching transistor of a DRAM memory cell is being considered, for example.

In a case where an oxide semiconductor transistor is applied to a switching transistor of a memory cell, for example, the oxide semiconductor transistor is subjected to a heat treatment accompanying the formation of wiring lines formed in an upper layer. Therefore, an oxide semiconductor transistor having stable characteristics that hardly fluctuate during the heat treatment is expected to be provided.

Figure 3:
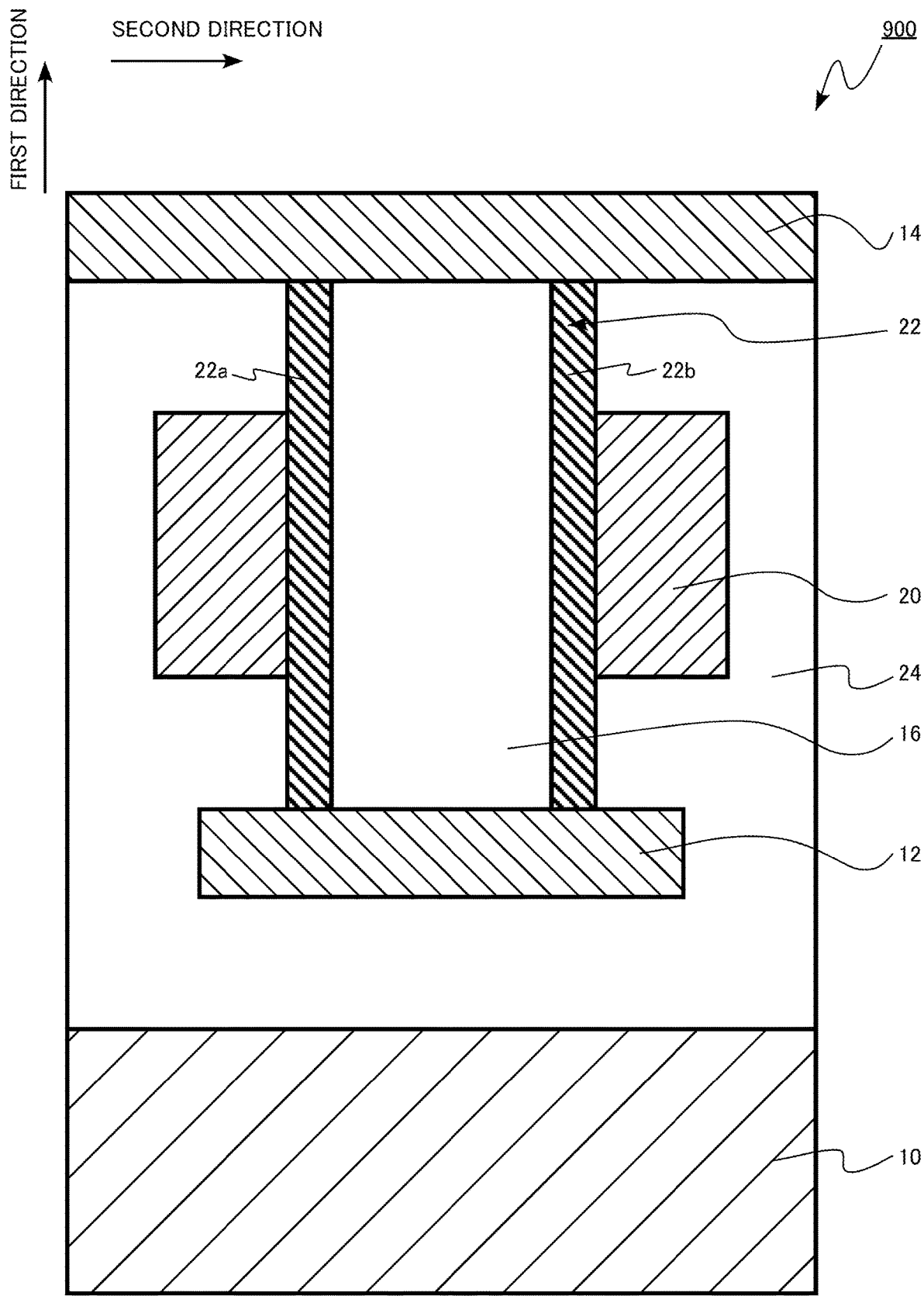
FIG. 3 is a schematic cross-sectional view of a semiconductor device of a comparative example.

FIG. 3 is a schematic cross-sectional view of a semiconductor device of a comparative example. FIG. 3 is a diagram corresponding to FIG. 1 showing the semiconductor device of the first embodiment.

The semiconductor device of the comparative example is a transistor 900. The transistor 900 is an oxide semiconductor transistor in which a channel is formed in an oxide semiconductor. The transistor 900 differs from the transistor 100 of the first embodiment in not including the contact layer 18.

The transistor 900 of the comparative example has characteristics that fluctuate due to the heat treatment performed after the formation of the transistor structure.

Particularly, in a case where the heat treatment is performed in an oxygen-containing atmosphere, the asymmetry of the on-current becomes a problem. The on-current asymmetry means that there is a difference in the magnitude of the on-current between a case where the current flows from the upper electrode 14 toward the lower electrode 12 and a case where the current flows from the lower electrode 12 toward the upper electrode 14.

More specifically, the on-current in the direction from the lower electrode 12 toward the upper electrode 14 is smaller than the on-current in the direction from the upper electrode 14 toward the lower electrode 12.

Figure 4A:
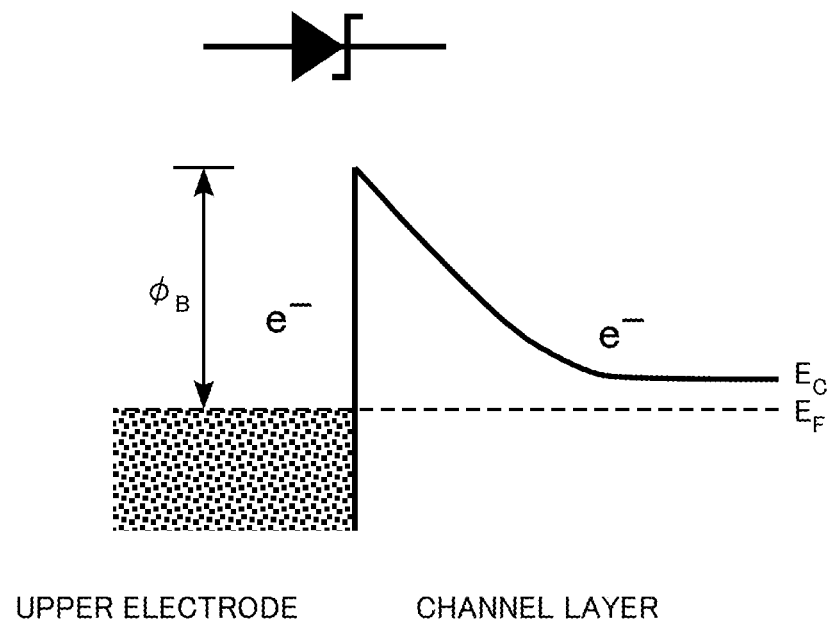
FIGS. 4A and 4B are diagrams for explaining the functions and the effects of the semiconductor device of the first embodiment.
Figure 4B:
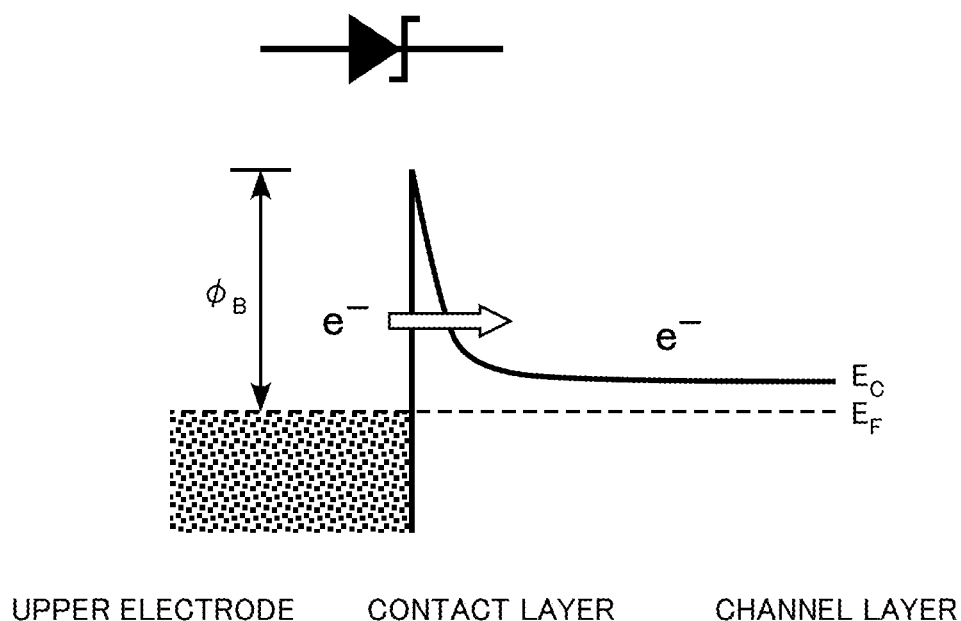

FIGS. 4A and 4B are diagrams for explaining the functions and the effects of the semiconductor device of the first embodiment. FIG. 4A is a band diagram showing the vicinity of the interface between the upper electrode 14 and the channel layer 16 of the transistor 900 of the comparative example. FIG. 4B is a band diagram showing the vicinity of the interface between the upper electrode 14 and the contact layer 18 of the transistor 100 of the first embodiment. FIGS. 4A and 4B are band diagrams showing the situations after a heat treatment is performed in an oxygen-containing atmosphere after the formation of the transistor structure.

As shown in FIG. 4A, a Schottky barrier is formed at the interface between the upper electrode 14 and the channel layer 16. In other words, a Schottky diode is formed between the upper electrode 14 and the channel layer 16.

In a case where the transistor 900 is subjected to a heat treatment in an oxygen-containing atmosphere, oxygen diffuses into the channel layer 16 from the atmosphere, so that the density of the oxygen deficiency in the channel layer 16 in the vicinity of the upper electrode 14 drops. As a result, the carrier concentration in the channel layer 16 in the vicinity of the upper electrode 14 drops. As the carrier concentration in the channel layer 16 in the vicinity of the upper electrode 14 becomes lower, the width of the Schottky barrier becomes wider.

On the other hand, the amount of oxygen diffusing in the channel layer 16 in the vicinity of the lower electrode 12 is smaller than the amount of oxygen diffusing in the channel layer 16 in the vicinity of the upper electrode 14. Therefore, the decrease in the carrier concentration in the channel layer 16 in the vicinity of the lower electrode 12 is small. Accordingly, the change in the width of the Schottky barrier between the channel layer 16 and the lower electrode 12 is small.

Because of this, the on-current in the direction from the channel layer 16 toward the upper electrode 14 is smaller than the on-current in the direction from the upper electrode 14 toward the channel layer 16.

In the transistor 100 of the first embodiment, the contact layer 18 is disposed between the upper electrode 14 and the channel layer 16. As shown in FIG. 4B, in the case of the transistor 100 of the first embodiment, a Schottky barrier is also formed at the interface between the upper electrode 14 and the contact layer 18. In other words, a Schottky diode is formed between the upper electrode 14 and the contact layer 18.

The carrier concentration in the contact layer 18 is higher than the carrier concentration in the channel layer 16. Therefore, even if the heat treatment is performed in an oxygen-containing atmosphere, and oxygen diffuses into the contact layer 18, the carrier concentration in the contact layer 18 does not greatly change. Since the carrier concentration in the contact layer 18 is high, the Schottky barrier width at the interface between the upper electrode 14 and the contact layer 18 is smaller than that in the transistor 900 of the comparative example. Accordingly, it becomes easier for electrons to tunnel through the Schottky barrier from the upper electrode 14 toward the contact layer 18. In other words, the current in the direction from the channel layer 16 toward the upper electrode 14 flows easier than that in the transistor 900 of the comparative example.

As a result, even in a case where the heat treatment is performed in an oxygen-containing atmosphere, a difference is not easily generated in the magnitude of the on-current between a case where the current flows from the upper electrode 14 toward the lower electrode 12 and a case where the current flows from the lower electrode 12 toward the upper electrode 14. Thus, the on-current asymmetry caused by the heat treatment is reduced. As the on-current asymmetry is reduced, the fluctuations in the transistor characteristics are also reduced. Thus, with the transistor 100, the asymmetry of the on-current after the heat treatment is reduced, and an oxide semiconductor transistor having stable characteristics is obtained.

To make the carrier concentration in the contact layer 18 higher than the carrier concentration in the channel layer 16, the atomic concentration of the tin (Sn) contained in the contact layer 18 is preferably higher than the atomic concentration of the tin (Sn) contained in the channel layer 16.

To make the carrier concentration in the contact layer 18 higher than the carrier concentration in the channel layer 16, the atomic concentration of the indium (In) contained in the contact layer 18 is preferably higher than the atomic concentration of the indium (In) contained in the channel layer 16, for example.

(First Modification)

Figure 5:
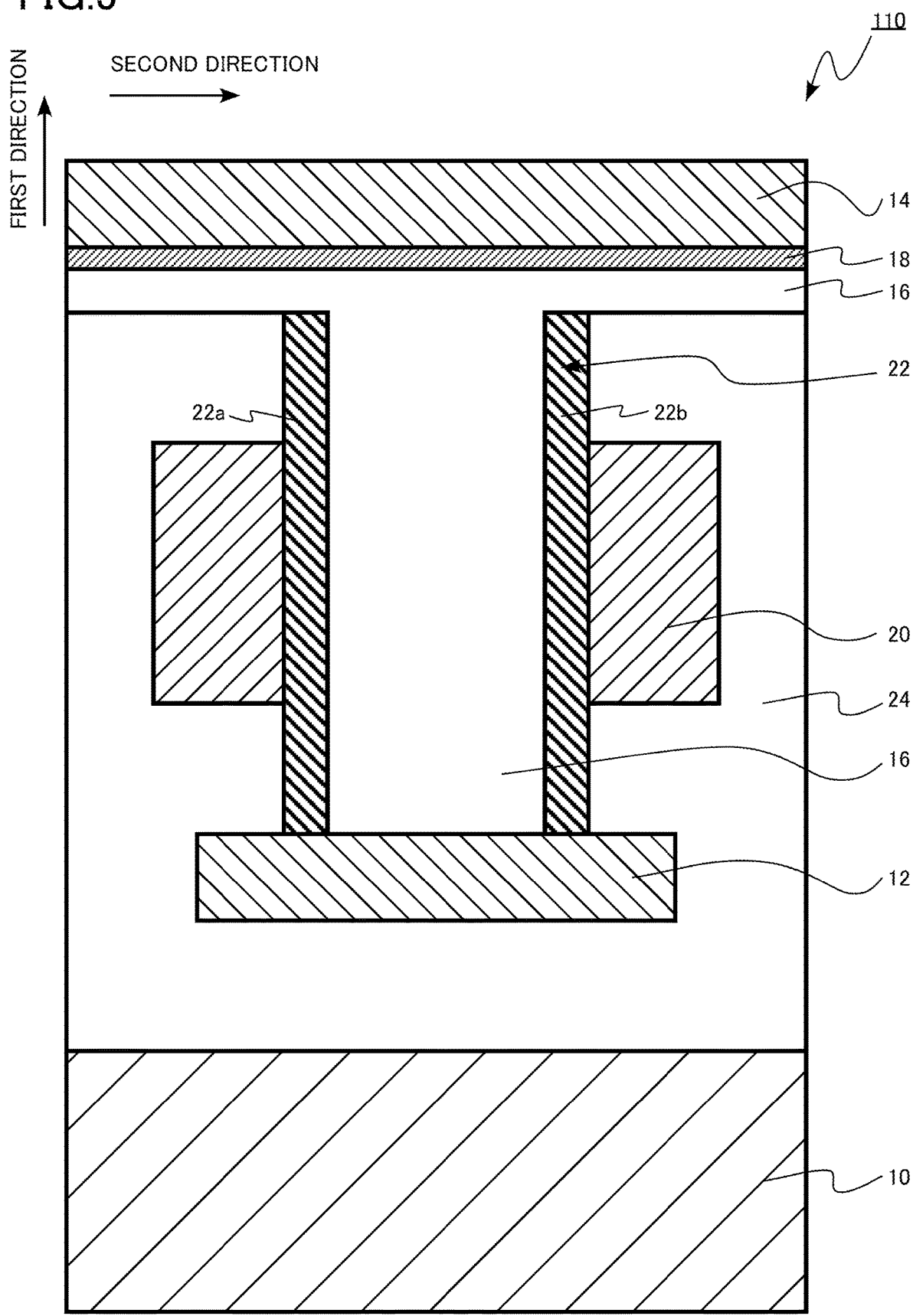
FIG. 5 is a schematic cross-sectional view of a first modification of the semiconductor device of the first embodiment.

FIG. 5 is a schematic cross-sectional view of a first modification of the semiconductor device of the first embodiment. FIG. 5 is a diagram corresponding to FIG. 1 showing the semiconductor device of the first embodiment.

The first modification of the semiconductor device of the first embodiment is a transistor 110. The transistor 110 differs from the transistor 100 of the first embodiment in that the channel layer 16 is disposed between the contact layer 18 and the interlayer insulating layer 24.

In the transistor 110 of the first modification, the resistance between the contact layer 18 and the channel layer 16 is lowered, and the on-current becomes greater than that in the transistor 100 of the first embodiment.

(Second Modification)

Figure 6:
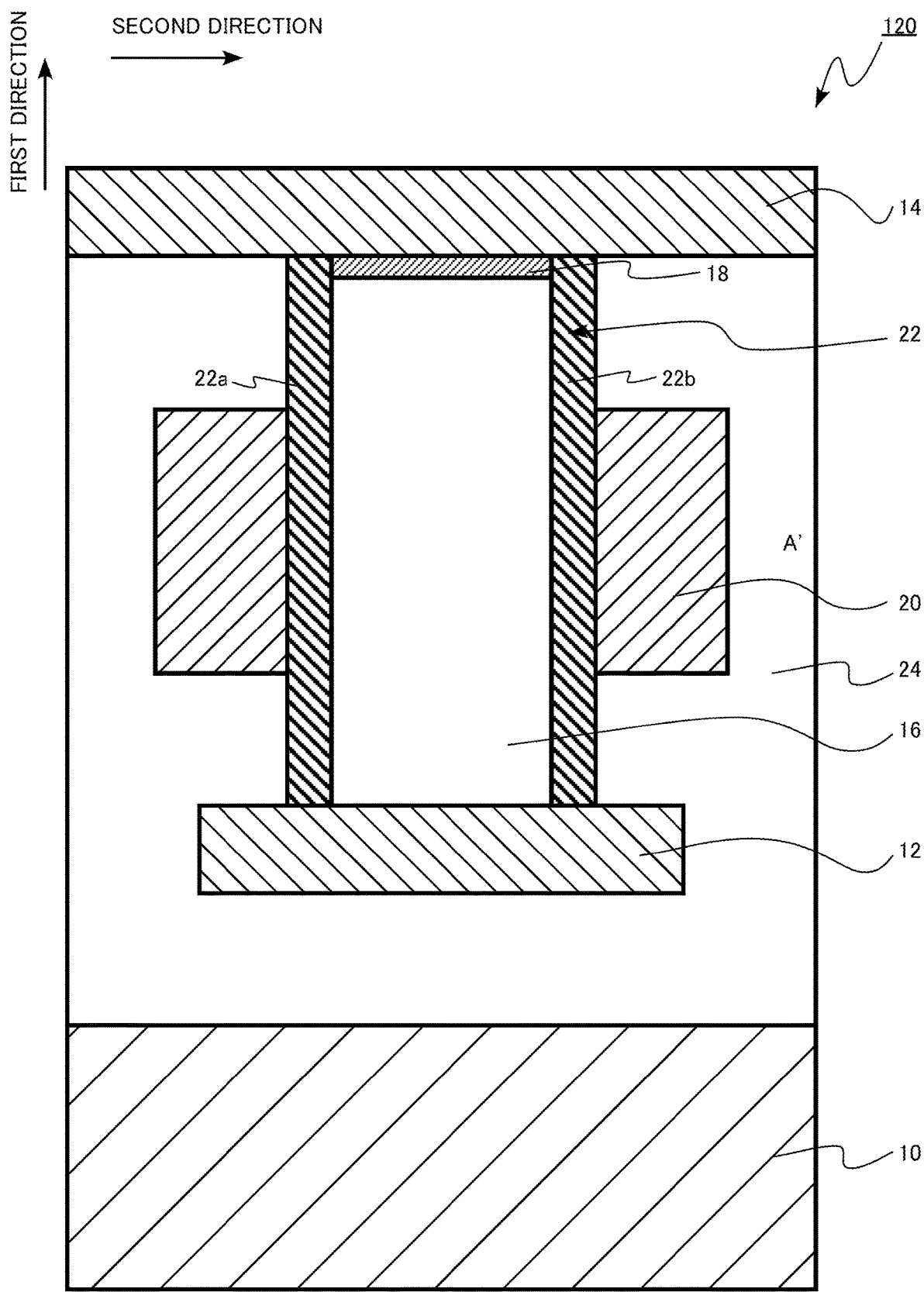
FIG. 6 is a schematic cross-sectional view of a second modification of the semiconductor device of the first embodiment.

FIG. 6 is a schematic cross-sectional view of a second modification of the semiconductor device of the first embodiment. FIG. 6 is a diagram corresponding to FIG. 1 showing the semiconductor device of the first embodiment.

The second modification of the semiconductor device of the first embodiment is a transistor 120. The transistor 120 differs from the transistor 100 of the first embodiment in that the contact layer 18 is interposed or surrounded by the gate insulating layer 22.

(Third Modification)

Figure 7:
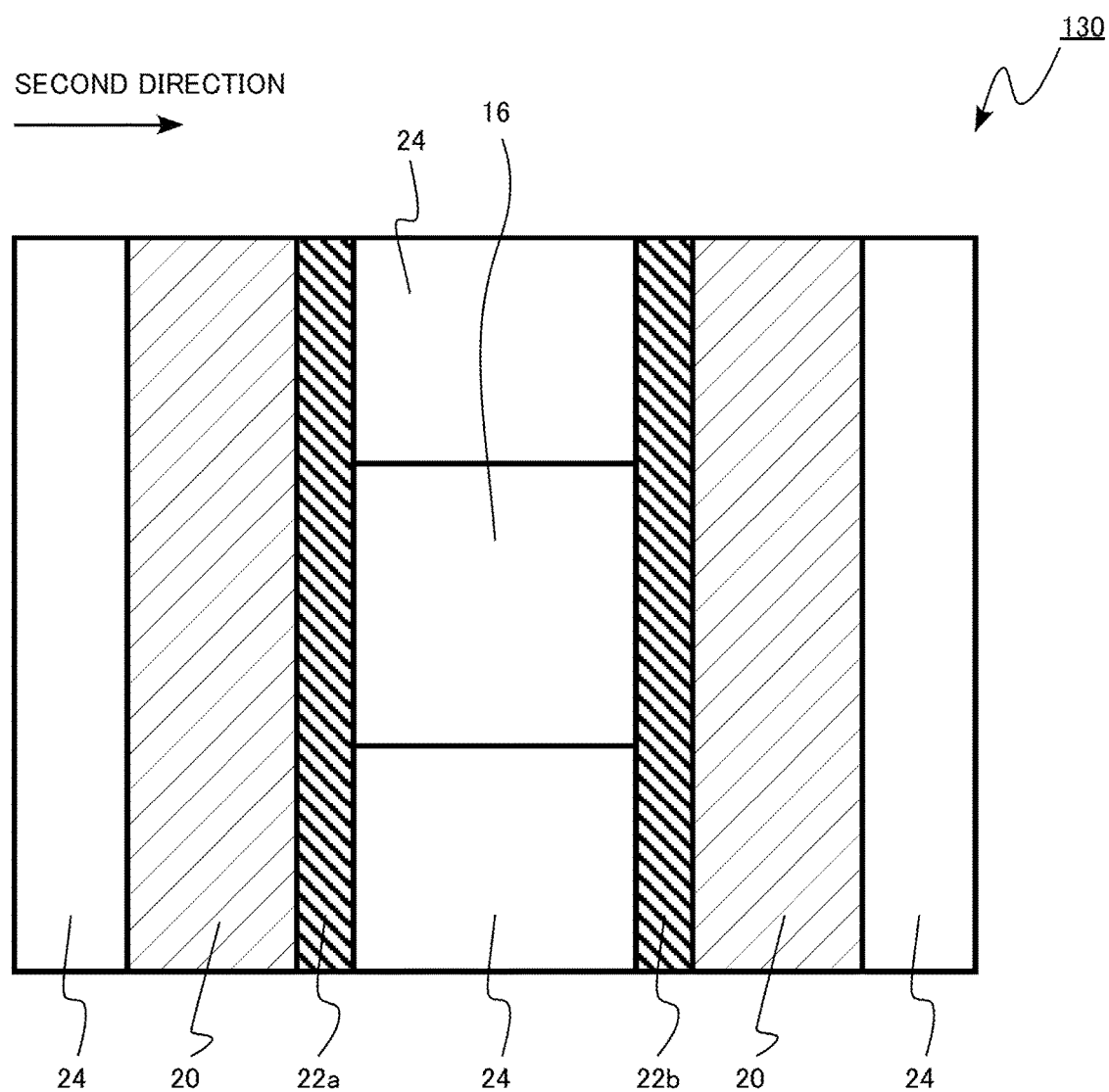
FIG. 7 is a schematic cross-sectional view of a third modification of the semiconductor device of the first embodiment.

FIG. 7 is a schematic cross-sectional view of a third modification of the semiconductor device of the first embodiment. FIG. 7 is a diagram corresponding to FIG. 2 showing the semiconductor device of the first embodiment.

The third modification of the semiconductor device of the first embodiment is a transistor 130. The transistor 130 differs from the transistor 100 of the first embodiment in that the first region 22a and the second region 22b of the gate insulating layer 22 are separated from each other. In the transistor 130, the gate electrode 20 is also divided into different regions on the right and left sides.

As described above, the first embodiment and its modifications reduce the asymmetry of the on-current after the heat treatment, and provide an oxide semiconductor transistor having stable characteristics.

Second Embodiment

A semiconductor device of a second embodiment differs from the semiconductor device of the first embodiment in that, in a cross-section parallel to a first direction from the first electrode toward the second electrode and including the oxide semiconductor layer, a first distance between the first region and the second region in a second direction perpendicular to the first direction at a first position is smaller than a second distance between the first region and the second region in the second direction at a second position, a distance between the first electrode and the second position in the first direction is greater than a distance between the first electrode and the first position in the first direction. In the description below, some explanation of the same aspects as those of the first embodiment may not be repeated.

Figure 8:
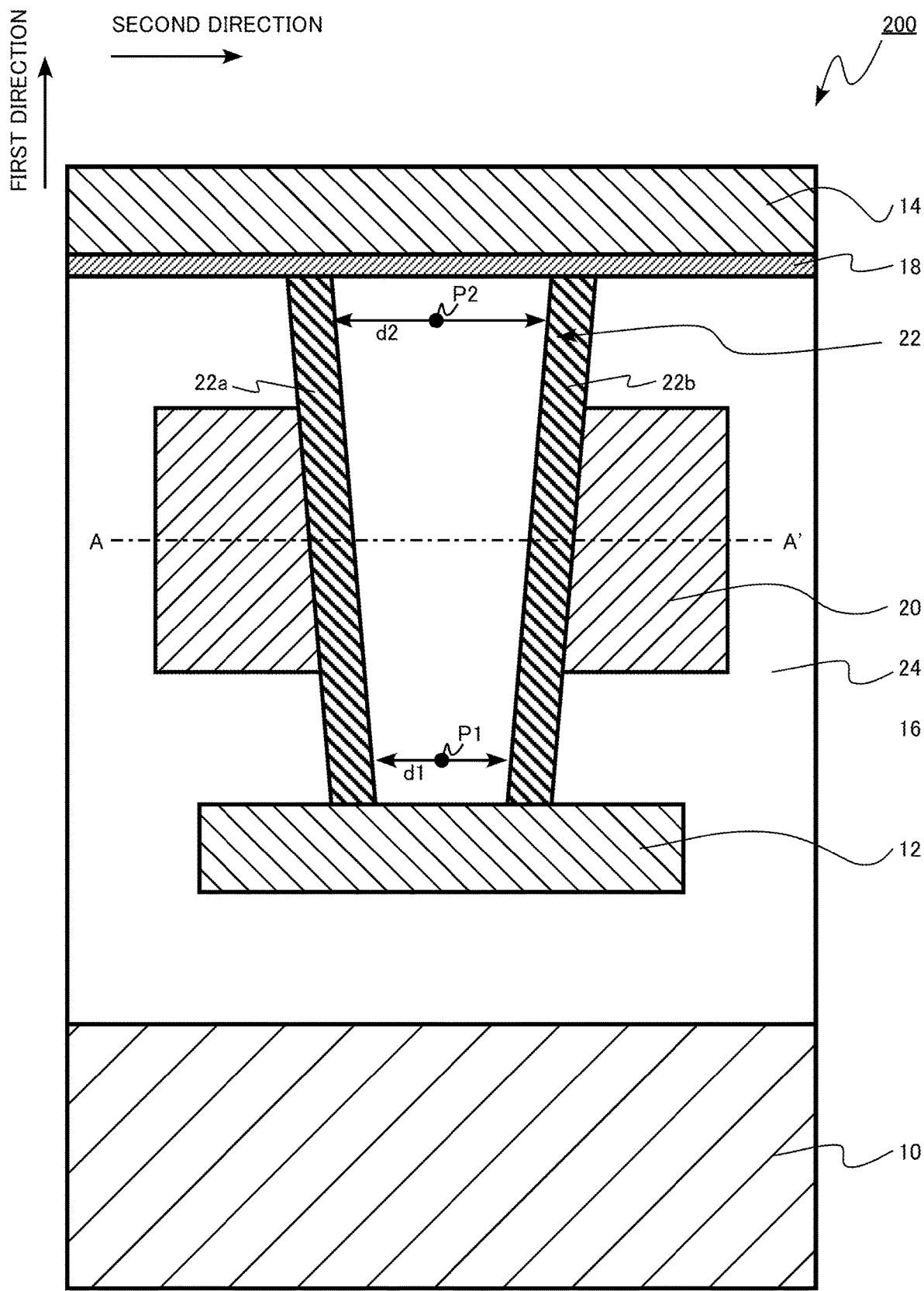
FIG. 8 is a schematic cross-sectional view of a semiconductor device of a second embodiment.

FIG. 8 is a schematic cross-sectional view of a semiconductor device of the second embodiment.

The semiconductor device of the second embodiment is a transistor 200. The transistor 200 is an oxide semiconductor transistor in which a channel is formed in an oxide semiconductor. The transistor 200 is a so-called SGT in which a gate electrode is disposed so as to surround the oxide semiconductor layer in which the channel is formed. The transistor 200 is a so-called vertical transistor.

The transistor 200 includes a silicon substrate 10, a lower electrode 12, an upper electrode 14, a channel layer 16, a contact layer 18, a gate electrode 20, a gate insulating layer 22, and an interlayer insulating layer 24. The gate insulating layer 22 includes a first region 22a and a second region 22b.

The silicon substrate 10 is an example of the substrate. The lower electrode 12 is an example of the first electrode. The upper electrode 14 is an example of the second electrode. The channel layer 16 is an example of the oxide semiconductor layer. The contact layer 18 is an example of the conductive layer.

In the transistor 200, in a cross-section that is parallel to the first direction from the lower electrode 12 toward the upper electrode 14 and includes the channel layer 16, the first distance (d1 in FIG. 8) between the first region 22a and the second region 22b at the first position (P1 in FIG. 8) is smaller than the second distance (d2 in FIG. 8) between the first region 22a and the second region 22b at the second position (P2 in FIG. 8) at which the distance from the lower electrode 12 is greater than the distance between the lower electrode 12 and the first position P1.

The width of the channel layer 16 in the second direction is greater at a position closer to the upper electrode 14, and is smaller at a position closer to the lower electrode 12. The side surface of the channel layer 16 has a forward tapered shape.

For example, when the transistor 200 is manufactured, the lower electrode 12, the gate electrode 20, and the interlayer insulating layer 24 are formed, and a hole pattern for filling the gate insulating layer 22 and the channel layer 16 is then formed. When the hole pattern is formed, the etching is controlled so that the diameter of the lower portion of each hole becomes smaller. Thus, the above structure can be formed.

As described above, like the first embodiment, the second embodiment reduces the asymmetry of the on-current after the heat treatment, and provides an oxide semiconductor transistor having stable characteristics.

Third Embodiment

A semiconductor device of a third embodiment differs from the semiconductor device of the first embodiment in further including an insulating layer that is disposed between the first electrode and the second electrode, and is surrounded by an oxide semiconductor layer. In the description below, some explanation of the same aspects as those of the first embodiment may not be repeated.

Figure 9:
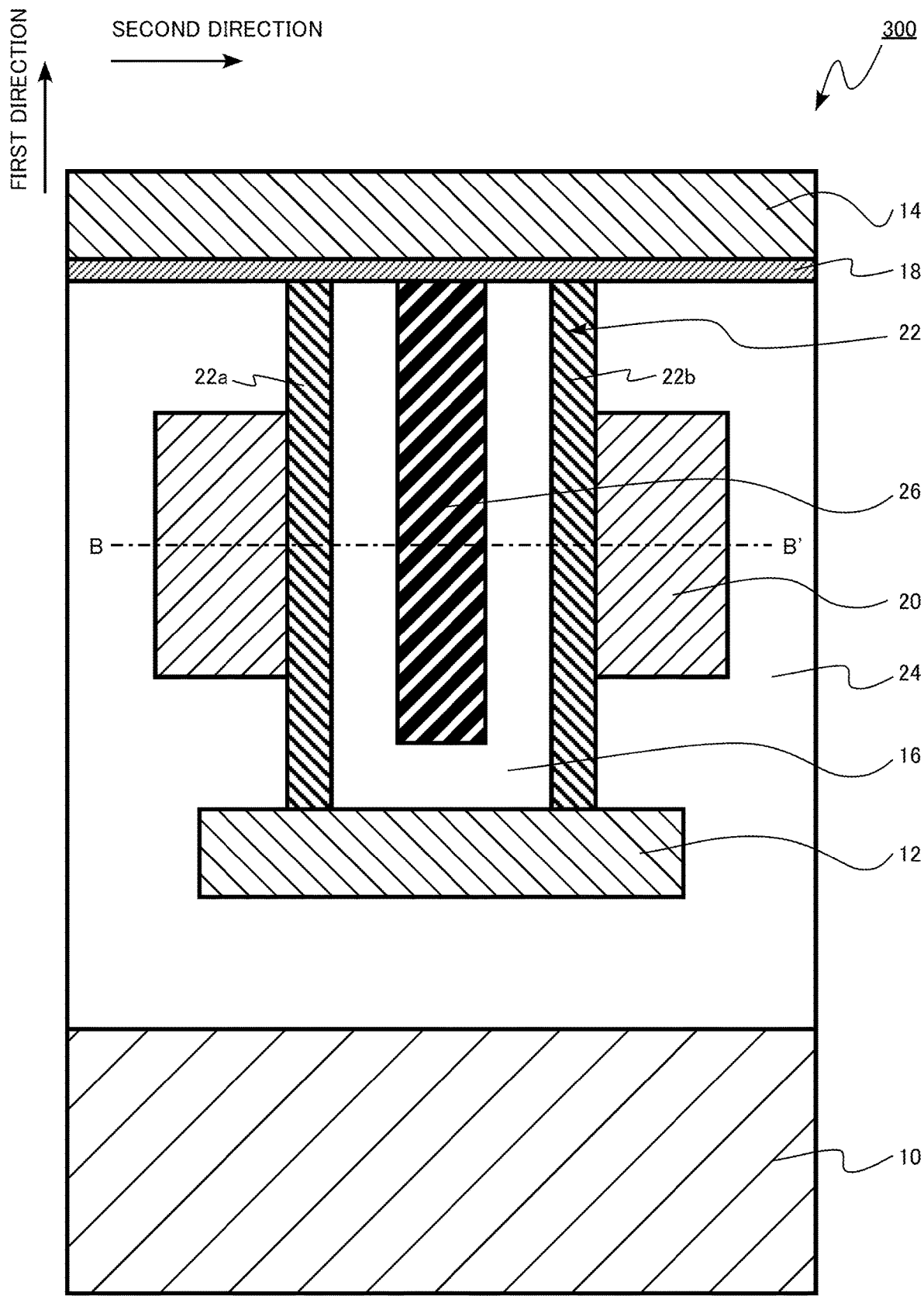
FIG. 9 is a schematic cross-sectional view of a semiconductor device of a third embodiment.
Figure 10:
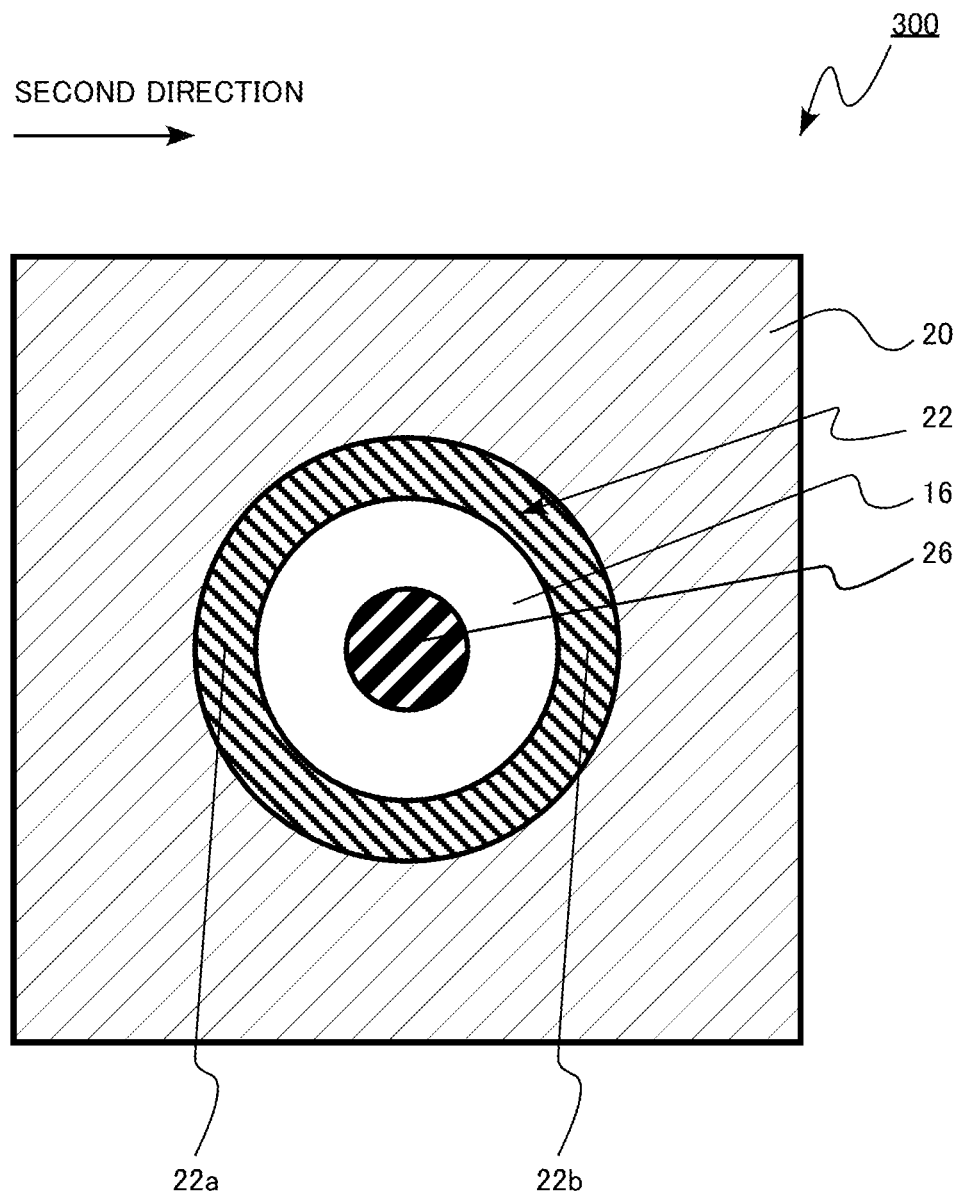
FIG. 10 is a schematic cross-sectional view of the semiconductor device of the third embodiment.

FIGS. 9 and 10 are schematic cross-sectional views of the semiconductor device of the third embodiment. FIG. 10 is a cross-sectional view taken along the B-B' line defined in FIG. 9. In FIG. 9, the vertical direction is referred to as the first direction. In FIG. 9, the horizontal direction is referred to as the second direction. The second direction is perpendicular to the first direction.

The semiconductor device of the third embodiment is a transistor 300. The transistor 300 is an oxide semiconductor transistor in which a channel is formed in an oxide semiconductor. The transistor 300 is a so-called SGT in which a gate electrode is disposed so as to surround the oxide semiconductor layer in which the channel is formed. The transistor 300 is a so-called vertical transistor.

The transistor 300 includes a silicon substrate 10, a lower electrode 12, an upper electrode 14, a channel layer 16, a contact layer 18, a gate electrode 20, a gate insulating layer 22, an interlayer insulating layer 24, and a core insulating layer 26. The gate insulating layer 22 includes a first region 22a and a second region 22b.

The silicon substrate 10 is an example of the substrate. The lower electrode 12 is an example of the first electrode. The upper electrode 14 is an example of the second electrode. The channel layer 16 is an example of the oxide semiconductor layer. The contact layer 18 is an example of the conductive layer. The core insulating layer 26 is an example of the insulating layer.

The core insulating layer 26 is disposed between the lower electrode 12 and the upper electrode 14. The core insulating layer 26 is surrounded by the channel layer 16. Part of the channel layer 16 is disposed between the lower electrode 12 and the core insulating layer 26, for example.

The core insulating layer 26 is an oxide, a nitride, or an oxynitride, for example. The core insulating layer 26 contains a silicon oxide, a silicon nitride, or a silicon oxynitride, for example.

As the core insulating layer 26 is provided in the transistor 300, the thickness of the channel layer 16 in the second direction becomes smaller, for example. As the channel layer 16 becomes thinner, the gate electrode 20 has an improved controllability on the electric potential of the channel layer 16. Thus, the cutoff characteristics of the transistor 300 are improved, for example.

(Modification)

Figure 11:
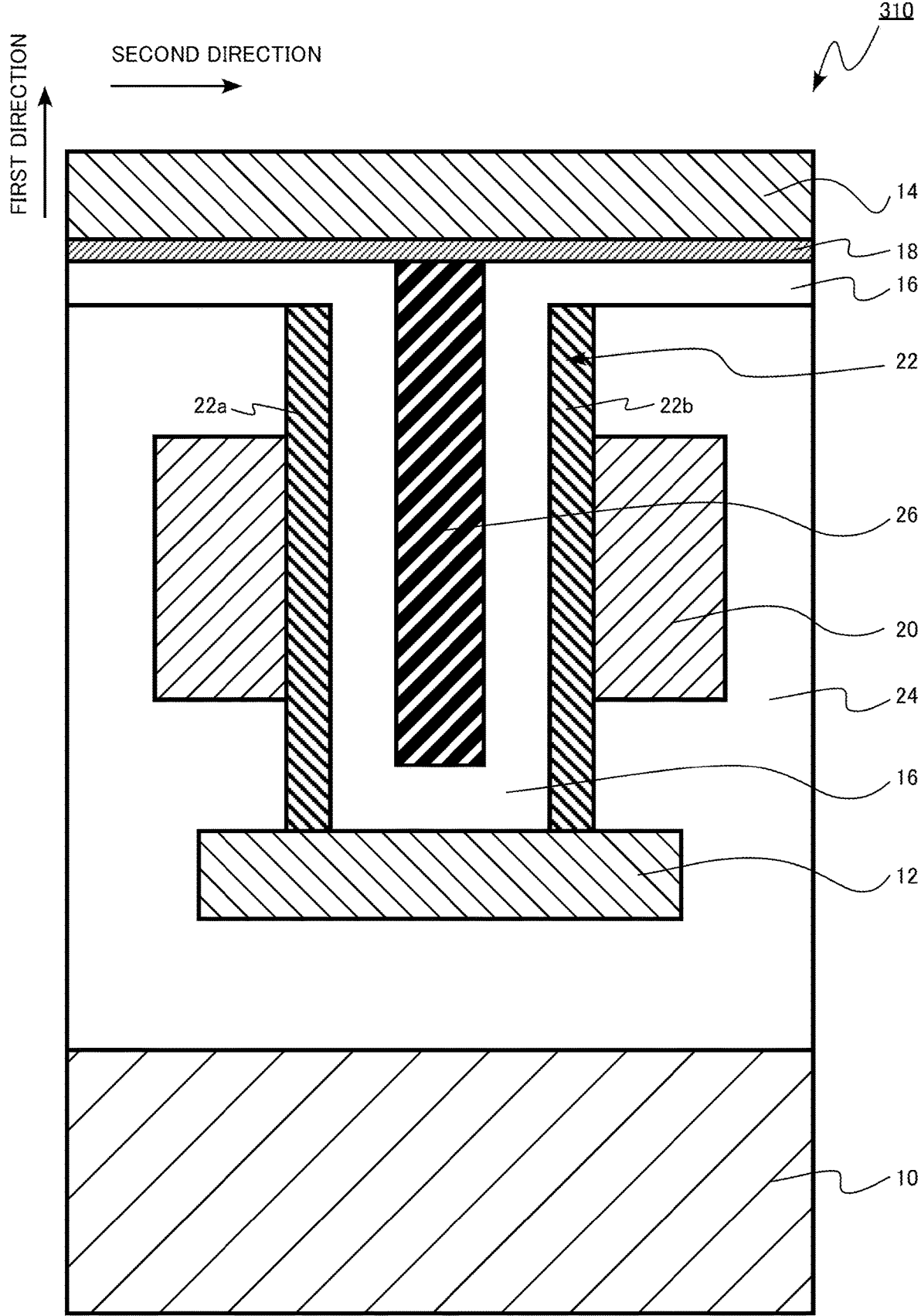
FIG. 11 is a schematic cross-sectional view of a modification of the semiconductor device of the third embodiment.

FIG. 11 is a schematic cross-sectional view of a modification of the semiconductor device of the third embodiment. FIG. 11 is a diagram corresponding to FIG. 9 showing the semiconductor device of the third embodiment.

The modification of the semiconductor device of the third embodiment is a transistor 310. The transistor 310 differs from the transistor 300 of the third embodiment in that the channel layer 16 is disposed between the contact layer 18 and the interlayer insulating layer 24.

In the transistor 310 of the modification, the resistance between the contact layer 18 and the channel layer 16 is lowered, and the on-current becomes greater than that in the transistor 300 of the third embodiment.

As described above, like the first embodiment, the third embodiment and its modification reduce the asymmetry of the on-current after the heat treatment, and provide an oxide semiconductor transistor having stable characteristics.

Fourth Embodiment

A semiconductor memory device of a fourth embodiment includes: a first electrode; a second electrode; an oxide semiconductor layer provided between the first electrode and the second electrode, the oxide semiconductor layer being in contact with the first electrode, the oxide semiconductor layer containing zinc (Zn) and at least one first element selected from the group consisting of indium (In), gallium (Ga), silicon (Si), aluminum (Al), and tin (Sn), and a chemical composition of the oxide semiconductor layer being different from a chemical composition of the first electrode and the second electrode; a conductive layer provided between the oxide semiconductor layer and the second electrode, the conductive layer being in contact with the second electrode, the conductive layer containing oxygen (O) and at least one second element selected from the group consisting of indium (In), gallium (Ga), silicon (Si), aluminum (Al), tin (Sn), zinc (Zn), and titanium (Ti), and a chemical composition of the conductive layer being different from a chemical composition of the first electrode, the second electrode, and the oxide semiconductor layer; a gate electrode; a gate insulating layer provided between the oxide semiconductor layer and the gate electrode; and a capacitor electrically connected to the first electrode.

The semiconductor memory device of the fourth embodiment is a semiconductor memory 400. The semiconductor memory device of the fourth embodiment is a DRAM. The semiconductor memory 400 uses the transistor 100 of the first embodiment as a switching transistor of a DRAM memory cell.

In the description below, part of the explanation of the same aspects as those of the first embodiment will not be repeated.

Figure 12:
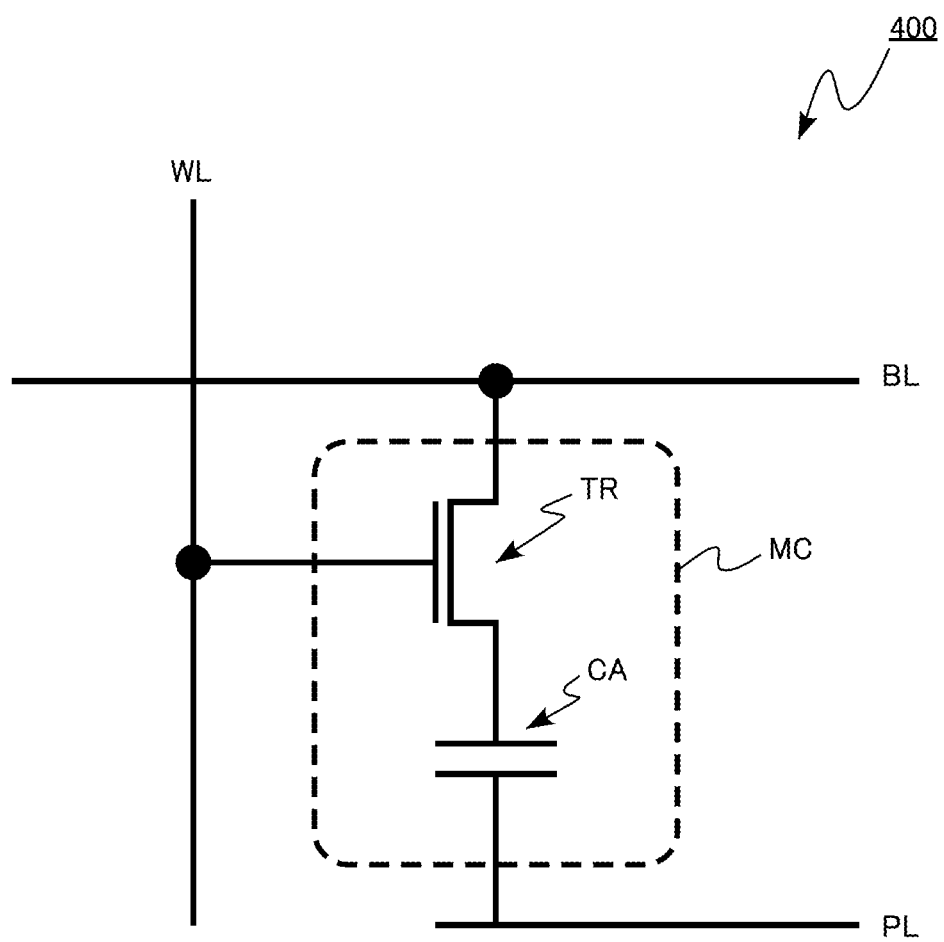
FIG. 12 is an equivalent circuit diagram of a semiconductor memory device of a fourth embodiment.

FIG. 12 is an equivalent circuit diagram of the semiconductor memory device of the fourth embodiment. Although FIG. 12 illustrates an example case where one memory cell MC is provided, a plurality of memory cells MC may be provided.

The semiconductor memory 400 includes a memory cell MC, a word line WL, a bit line BL, and a plate line PL. The memory cell MC includes a switching transistor TR and a capacitor CA. The region surrounded by a dashed line in FIG. 12 is the memory cell MC.

The word line WL is electrically connected to the gate electrode of the switching transistor TR. The bit line BL is electrically connected to one of the source/drain electrodes of the switching transistor TR. One electrode of the capacitor CA is electrically connected to the other one of the source/drain electrodes of the switching transistor TR. The other electrode of the capacitor CA is connected to the plate line PL.

The memory cell MC stores data by accumulating electric charge in the capacitor CA. The switching transistor TR is made to perform an on-operation, to write and read data.

For example, while a desired voltage is being applied to the bit line BL, the switching transistor TR is made to perform an on-operation, so that data is written into the memory cell MC.

Also, the switching transistor TR is made to perform an on-operation, so that a voltage change in the bit line BL depending on the amount of the electric charge stored in the capacitor is detected, and the data in the memory cell MC is read out, for example.

Figure 13:
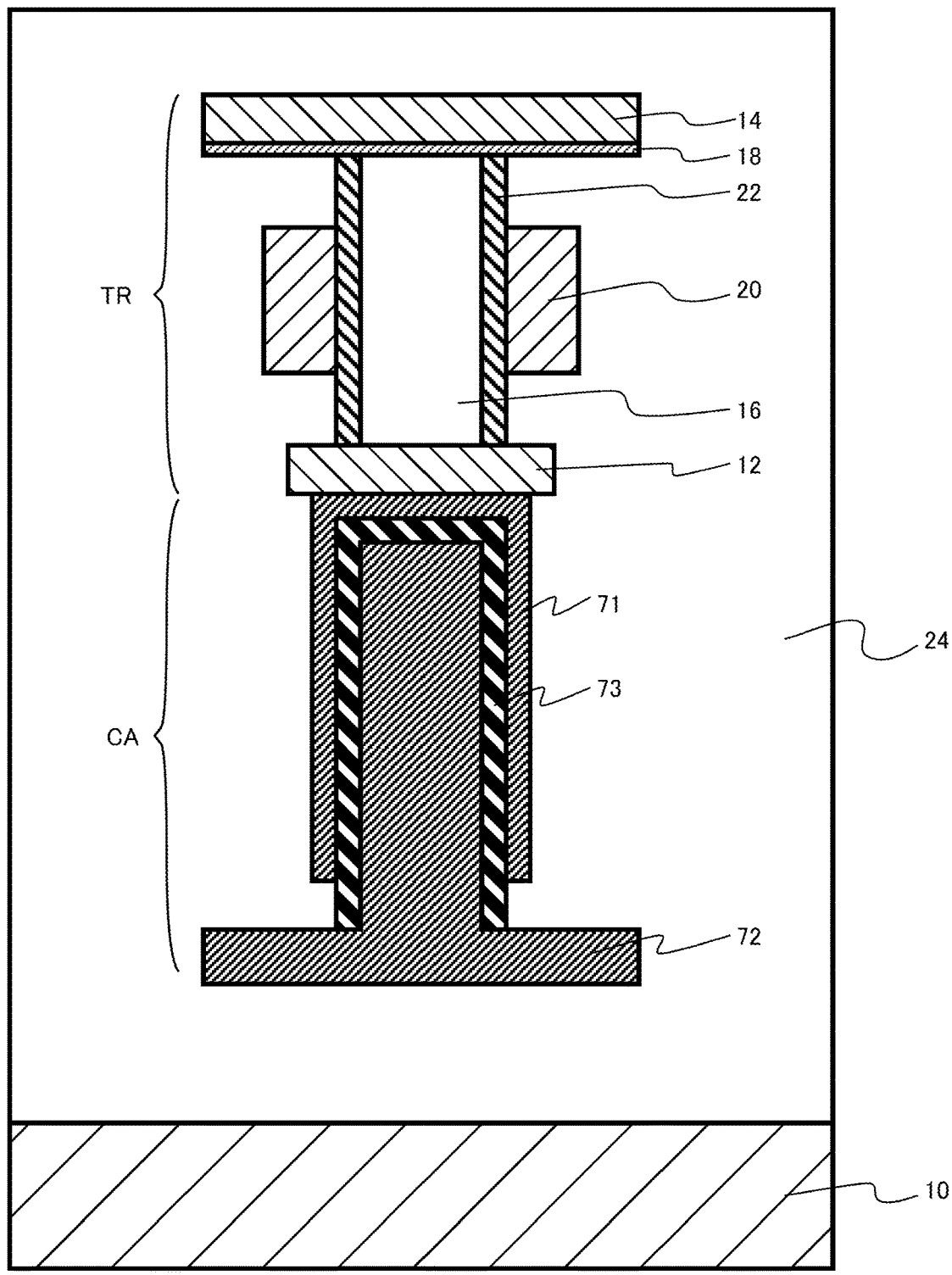
FIG. 13 is a schematic cross-sectional view of the semiconductor memory device of the fourth embodiment.

FIG. 13 is a schematic cross-sectional view of the semiconductor memory device of the fourth embodiment. FIG. 13 shows a cross-section of the memory cell MC of the semiconductor memory 400.

The semiconductor memory 400 includes a silicon substrate 10, the switching transistor TR, the capacitor CA, and an interlayer insulating layer 24. The silicon substrate 10 is an example of the substrate.

The switching transistor TR includes a lower electrode 12, an upper electrode 14, a channel layer 16, a contact layer 18, a gate electrode 20, and a gate insulating layer 22. The lower electrode 12 is an example of the first electrode. The upper electrode 14 is an example of the second electrode. The channel layer 16 is an example of the oxide semiconductor layer. The contact layer 18 is an example of the conductive layer.

The switching transistor TR has the same structure as that of the transistor 100 of the first embodiment.

The capacitor CA is disposed between the silicon substrate 10 and the switching transistor TR. The capacitor CA is disposed between the silicon substrate 10 and the lower electrode 12. The capacitor CA is electrically connected to the lower electrode 12.

The capacitor CA includes a cell electrode 71, a plate electrode 72, and a capacitor insulating film 73. The cell electrode 71 is electrically connected to the lower electrode 12. The cell electrode 71 is in contact with the lower electrode 12, for example.

The cell electrode 71 and the plate electrode 72 are made of a titanium nitride, for example. The capacitor insulating film 73 has a stacked structure of a zirconium oxide, an aluminum oxide, and a zirconium oxide, for example.

The gate electrode 20 is electrically connected to the word line WL (not shown), for example. The upper electrode 14 is electrically connected to the bit line BL (not shown), for example. The plate electrode 72 is connected to the plate line PL (not shown), for example.

When the semiconductor memory 400 is manufactured, the switching transistor TR is formed after the capacitor CA is formed on the silicon substrate 10. When the switching transistor TR is formed, the channel layer 16, the contact layer 18, and the upper electrode 14 are formed in this order, after the formation of the lower electrode 12.

In the semiconductor memory 400, an oxide semiconductor transistor having an extremely small channel leakage current during an off-operation is used as the switching transistor TR. Thus, a DRAM having excellent charge retention characteristics is obtained.

Further, the switching transistor TR of the semiconductor memory 400 has the contact layer 18 between the channel layer 16 and the upper electrode 14. Accordingly, the on-current asymmetry caused by the heat treatment is reduced. Thus, the characteristics of the switching transistor TR become stable, and the characteristics of the semiconductor memory 400 also become stable.

As described above, the fourth embodiment reduces the asymmetry of the on-current after the heat treatment of a switching transistor, and provides a semiconductor memory having stable characteristics.

While certain embodiments have been described, these embodiments have been presented by way of example only, and are not intended to limit the scope of the inventions. Indeed, semiconductor devices and semiconductor memory devices described herein may be embodied in a variety of other forms; furthermore, various omissions, substitutions, and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate;
a first electrode;
a second electrode, the first electrode provided between the substrate and the second electrode;
an oxide semiconductor layer provided between the first electrode and the second electrode, the oxide semiconductor layer being in contact with the first electrode, the oxide semiconductor layer containing zinc (Zn) and at least one first element selected from the group consisting of indium (In), gallium (Ga), silicon (Si), aluminum (Al), and tin (Sn), and a chemical composition of the oxide semiconductor layer being different from a chemical composition of the first electrode and the second electrode;
a conductive layer provided between the oxide semiconductor layer and the second electrode, the conductive layer being in contact with the second electrode, the conductive layer containing oxygen (O) and at least one second element selected from the group consisting of indium (In), gallium (Ga), silicon (Si), aluminum (Al), tin (Sn), zinc (Zn), and titanium (Ti), and a chemical composition of the conductive layer being different from a chemical composition of the first electrode, the second electrode, and the oxide semiconductor layer;
a gate electrode; and
a gate insulating layer provided between the oxide semiconductor layer and the gate electrode.

2. The semiconductor device according to claim 1, wherein the gate electrode surrounds the oxide semiconductor layer.

3. The semiconductor device according to claim 1, further comprising an insulating layer provided between the first electrode and the second electrode, and the insulating layer being surrounded by the oxide semiconductor layer.

4. The semiconductor device according to claim 3, wherein a part of the oxide semiconductor layer is provided between the first electrode and the insulating layer.

5. The semiconductor device according to claim 1, wherein the oxide semiconductor layer is in contact with the conductive layer.

6. The semiconductor device according to claim 1, wherein a carrier concentration in the conductive layer is higher than a carrier concentration in the oxide semiconductor layer.

7. The semiconductor device according to claim 1, wherein an atomic concentration of tin (Sn) contained in the conductive layer is higher than an atomic concentration of tin (Sn) contained in the oxide semiconductor layer.

8. The semiconductor device according to claim 1, wherein an atomic concentration of indium (In) contained in the conductive layer is higher than an atomic concentration of indium (In) contained in the oxide semiconductor layer.

9. The semiconductor device according to claim 1, wherein
the gate insulating layer includes a first region and a second region, the oxide semiconductor layer provided between the first region and the second region, and,
in a cross-section parallel to a first direction from the first electrode toward the second electrode and including the oxide semiconductor layer, a first distance between the first region and the second region in a second direction perpendicular to the first direction at a first position is smaller than a second distance between the first region and the second region in the second direction at a second position, a distance between the first electrode and the second position in the first direction is greater than a distance between the first electrode and the first position in the first direction.

10. The semiconductor device according to claim 1, wherein the oxide semiconductor layer contains indium (In), gallium (Ga), and zinc (Zn).

11. A semiconductor device comprising:
a first electrode;
a second electrode;
an oxide semiconductor layer provided between the first electrode and the second electrode, the oxide semiconductor layer being in contact with the first electrode, the oxide semiconductor layer containing zinc (Zn) and at least one first element selected from the group consisting of indium (In), gallium (Ga), silicon (Si), aluminum (Al), and tin (Sn), and a chemical composition of the oxide semiconductor layer being different from a chemical composition of the first electrode and the second electrode;
a conductive layer provided between the oxide semiconductor layer and the second electrode, the conductive layer being in contact with the second electrode, the conductive layer containing oxygen (O) and at least one second element selected from the group consisting of indium (In), gallium (Ga), silicon (Si), aluminum (Al), tin (Sn), zinc (Zn), and titanium (Ti), and a chemical composition of the conductive layer being different from a chemical composition of the first electrode, the second electrode, and the oxide semiconductor layer;
a gate electrode; and
a gate insulating layer provided between the oxide semiconductor layer and the gate electrode, wherein
the gate insulating layer includes a first region and a second region, the oxide semiconductor layer provided between the first region and the second region, and,
in a cross-section parallel to a first direction from the first electrode toward the second electrode and including the oxide semiconductor layer, a first distance between the first region and the second region in a second direction perpendicular to the first direction at a first position is smaller than a second distance between the first region and the second region in the second direction at a second position, a distance between the first electrode and the second position in the first direction is greater than a distance between the first electrode and the first position in the first direction.

12. The semiconductor device according to claim 11, wherein the gate electrode surrounds the oxide semiconductor layer.

13. The semiconductor device according to claim 11, further comprising an insulating layer provided between the first electrode and the second electrode, and insulating layer being surrounded by the oxide semiconductor layer.

14. The semiconductor device according to claim 13, wherein a part of the oxide semiconductor layer is provided between the first electrode and the insulating layer.

15. The semiconductor device according to claim 11, wherein the oxide semiconductor layer is in contact with the conductive layer.

16. The semiconductor device according to claim 11, wherein a carrier concentration in the conductive layer is higher than a carrier concentration in the oxide semiconductor layer.

17. The semiconductor device according to claim 11, wherein an atomic concentration of tin (Sn) contained in the conductive layer is higher than an atomic concentration of tin (Sn) contained in the oxide semiconductor layer.

18. The semiconductor device according to claim 11, wherein an atomic concentration of indium (In) contained in the conductive layer is higher than an atomic concentration of indium (In) contained in the oxide semiconductor layer.

* * * * *